United States Patent
Hashimoto et al.

(10) Patent No.: US 11,967,499 B2
(45) Date of Patent: *Apr. 23, 2024

(54) METHOD OF PROCESSING SUBSTRATE, METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Yoshitomo Hashimoto, Toyama (JP); Tatsuru Matsuoka, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/977,635

(22) Filed: Oct. 31, 2022

(65) Prior Publication Data

US 2023/0049006 A1 Feb. 16, 2023

Related U.S. Application Data

(63) Continuation of application No. 16/905,343, filed on Jun. 18, 2020, now Pat. No. 11,515,143.

(30) Foreign Application Priority Data

Jun. 20, 2019 (JP) .................................. 2019-114560

(51) Int. Cl.
*H01L 21/02* (2006.01)
*C23C 16/36* (2006.01)
*C23C 16/52* (2006.01)

(52) U.S. Cl.
CPC .......... *H01L 21/0214* (2013.01); *C23C 16/36* (2013.01); *C23C 16/52* (2013.01)

(58) Field of Classification Search
None
See application file for complete search history.

(56) References Cited

U.S. PATENT DOCUMENTS

| | | | |
|---|---|---|---|
| 11,515,143 B2 * | 11/2022 | Hashimoto | ....... H01L 21/02326 |
| 2003/0087513 A1 | 5/2003 | Noguchi et al. | |
| 2004/0166680 A1 | 8/2004 | Miyajima et al. | |
| 2013/0164946 A1 | 6/2013 | Suzuki et al. | |

(Continued)

FOREIGN PATENT DOCUMENTS

| | | |
|---|---|---|
| JP | 2006-135363 A | 5/2006 |
| JP | 2014-075491 A | 4/2014 |

(Continued)

OTHER PUBLICATIONS

Korean Office Action dated Jan. 25, 2023 for Korean Patent Application No. 10-2022-0086290.

(Continued)

*Primary Examiner* — Asok K Sarkar
(74) *Attorney, Agent, or Firm* — Volpe Koenig

(57) ABSTRACT

There is provided a technique that includes (a) forming a first film having a first thickness on an underlayer by supplying a first process gas not including oxidizing gas to a substrate, wherein the first film contains silicon, carbon, and nitrogen and does not contain oxygen, and the underlayer is exposed on a surface of the substrate and is at least one selected from the group of a conductive metal-element-containing film and a nitride film; and (b) forming a second film having a second thickness larger than the first thickness on the first film by supplying a second process gas including oxidizing gas to the substrate, wherein the second film contains silicon, oxygen, and nitrogen, and wherein in (b), oxygen atoms derived from the oxidizing gas and diffuse from a surface of the first film toward the underlayer are absorbed by the first film and the first film is modified.

23 Claims, 7 Drawing Sheets

(56) References Cited

U.S. PATENT DOCUMENTS

| | | |
|---|---|---|
| 2015/0255274 A1 | 9/2015 | Yamamoto et al. |
| 2015/0287593 A1 | 10/2015 | Canaperi et al. |
| 2017/0025271 A1 | 1/2017 | Hashimoto et al. |
| 2017/0178902 A1 | 6/2017 | Hashimoto et al. |
| 2017/0222008 A1 | 8/2017 | Hsu et al. |
| 2018/0347047 A1 | 12/2018 | Hashimoto et al. |
| 2019/0035694 A1 | 1/2019 | More et al. |
| 2019/0145006 A1 | 5/2019 | Kitamura et al. |
| 2020/0043777 A1 | 2/2020 | Kung et al. |
| 2020/0165728 A1 | 5/2020 | Kitamura et al. |

FOREIGN PATENT DOCUMENTS

| | | |
|---|---|---|
| JP | 2017-028171 A | 2/2017 |
| JP | 2018-206827 A | 12/2018 |
| JP | 2019091819 A | 6/2019 |
| KR | 2017-0012132 A | 2/2017 |
| KR | 10-2018-0100772 A | 9/2018 |
| WO | 2020/178973 A1 | 9/2020 |

OTHER PUBLICATIONS

Written Opinion dated Feb. 11, 2021 for Singapore Patent Application No. 10202005751R.
Japanese Office Action dated Aug. 2, 2022 for Japanese Patent Application No. 2021-149940.
Japanese Office Action dated Apr. 4, 2023 for Japanese Patent Application No. 2021-149940.
Singapore Written Opinion dated Dec. 5, 2023 for Singapore Patent Application No. 10202200403X.

\* cited by examiner

METHOD OF PROCESSING SUBSTRATE, METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is a continuation application of U.S. patent application Ser. No. 16/905,343, filed Jun. 18, 2020 which is based upon and claims the benefit of priority from Japanese Patent Application No. 2019-114560, filed on Jun. 20, 2019, the entire contents of which are incorporated herein by reference.

TECHNICAL FIELD

The present disclosure relates to a method of manufacturing a semiconductor device, a substrate processing apparatus, and a recording medium.

BACKGROUND

As a process of manufacturing a semiconductor device, a process of forming a film on a substrate, of which an underlayer is exposed, is often carried out.

SUMMARY

The present disclosure provides some embodiments of a technique capable of suppressing oxidation of an underlayer while allowing a film formed on a substrate to become a low-dielectric-constant film.

According to one or more embodiments of the present disclosure, there is provided a technique that includes (a) forming a first film having a first thickness on an underlayer by supplying a first process gas to a substrate, wherein the first film contains silicon, carbon, and nitrogen and does not contain oxygen, the underlayer is exposed on a surface of the substrate and is at least one selected from the group of a conductive metal-element-containing film and a nitride film, and the first process gas does not include oxidizing gas; and (b) forming a second film having a second thickness on the first film by supplying a second process gas to the substrate, wherein the second film contains silicon, oxygen, and nitrogen, the second thickness is larger than the first thickness, and the second process gas includes oxidizing gas, and wherein in (b), oxygen atoms, which are derived from the oxidizing gas and diffuse from a surface of the first film toward the underlayer, are absorbed by the first film and the first film is modified.

DETAILED DESCRIPTION

First Embodiments of the Present Disclosure

First embodiments of the present disclosure will now be mainly described with reference to FIGS. 1 to 5 and 6A to 6C.

(1) Configuration of Substrate Processing Apparatus

Figure 1:
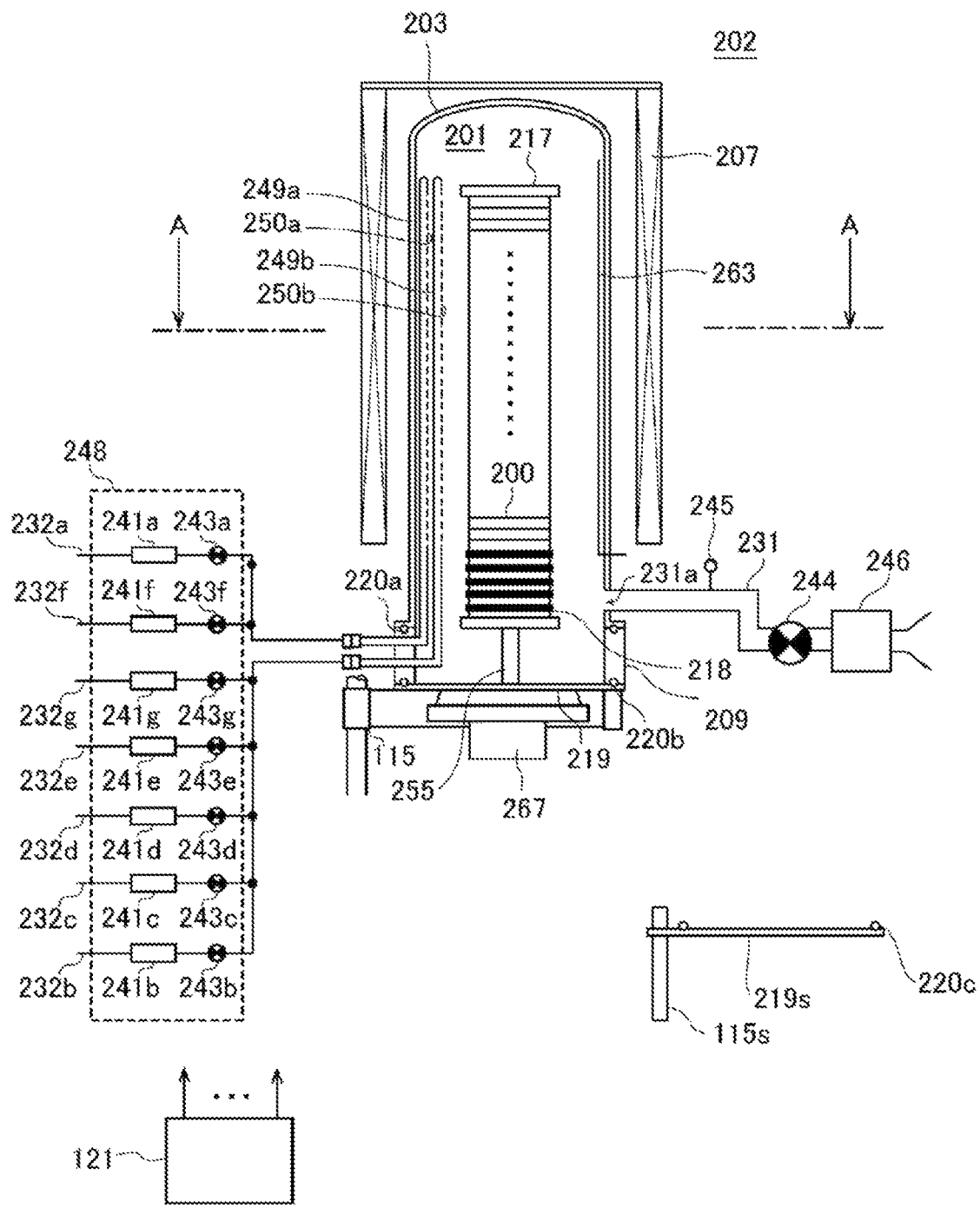
FIG. 1 is a schematic configuration diagram of a vertical type process furnace of a substrate processing apparatus suitably used in some embodiments of the present disclosure, in which a portion of the process furnace is shown in a vertical cross sectional view.

As illustrated in FIG. 1, a process furnace 202 includes a heater 207 as a heating mechanism (temperature adjustment part). The heater 207 has a cylindrical shape and is supported by a support plate to be vertically installed. The heater 207 also functions as an activation mechanism (an excitation part) configured to thermally activate (excite) gas.

A reaction tube 203 is disposed inside the heater 207 to be concentric with the heater 207. The reaction tube 203 is made of, for example, a heat resistant material such as quartz ($SiO_2$), silicon carbide (SiC), or the like, and has a cylindrical shape with its upper end closed and its lower end opened. A manifold 209 is disposed below the reaction tube 203 in a concentric relationship with the reaction tube 203. The manifold 209 is made of, for example, a metal material such as stainless steel (SUS), and has a cylindrical shape with its upper and lower ends opened. The upper end portion of the manifold 209 engages with the lower end portion of the reaction tube 203 so as to support the reaction tube 203. An O-ring 220a serving as a seal member is installed between the manifold 209 and the reaction tube 203. Similar to the heater 207, the reaction tube 203 is vertically installed. A process container (reaction container) mainly includes the reaction tube 203 and the manifold 209. A process chamber 201 is formed in a hollow cylindrical portion of the process container. The process chamber 201 is configured to accommodate wafers 200 as substrates. Processing on the wafers 200 is performed in the process chamber 201.

Nozzles 249a and 249b as first and second suppliers are installed in the process chamber 201 to penetrate a sidewall of the manifold 209. The nozzles 249a and 249b may also be referred to as a first nozzle and a second nozzle, respectively. The nozzles 249a and 249b are each made of, for example, a non-metallic material which is a heat resistant material such as quartz, SiC, or the like. The nozzles 249a and 249b are respectively configured as common nozzles used for supplying plural kinds of gases.

Gas supply pipes 232a and 232b as first and second pipes are connected to the nozzles 249a and 249b, respectively. The gas supply pipes 232a and 232b are respectively configured as common pipes used for supplying plural kinds of gases. Mass flow controllers (MFCs) 241a and 241b, which are flow rate controllers (flow rate control parts), and valves 243a and 243b, which are opening/closing valves, are installed in the gas supply pipes 232a and 232b sequentially from upstream sides of gas flow, respectively. A gas supply pipe 232f is connected to the gas supply pipe 232a at a downstream side of the valve 243a. An MFC 241f and a valve 243f are installed in the gas supply pipe 232f sequentially from upstream side of gas flow. Gas supply pipes 232c to 232e and 232g are respectively connected to the gas supply pipe 232b at a downstream side of the valve 243b. MFCs 241c to 241e and 241g and valves 243c to 243e and 243g are installed in the gas supply pipes 232c to 232e and 232g sequentially from upstream sides of gas flow, respectively. The gas supply pipes 232a to 232g are each made of a metal material such as, e.g., stainless steel (SUS) or the like.

Figure 2:
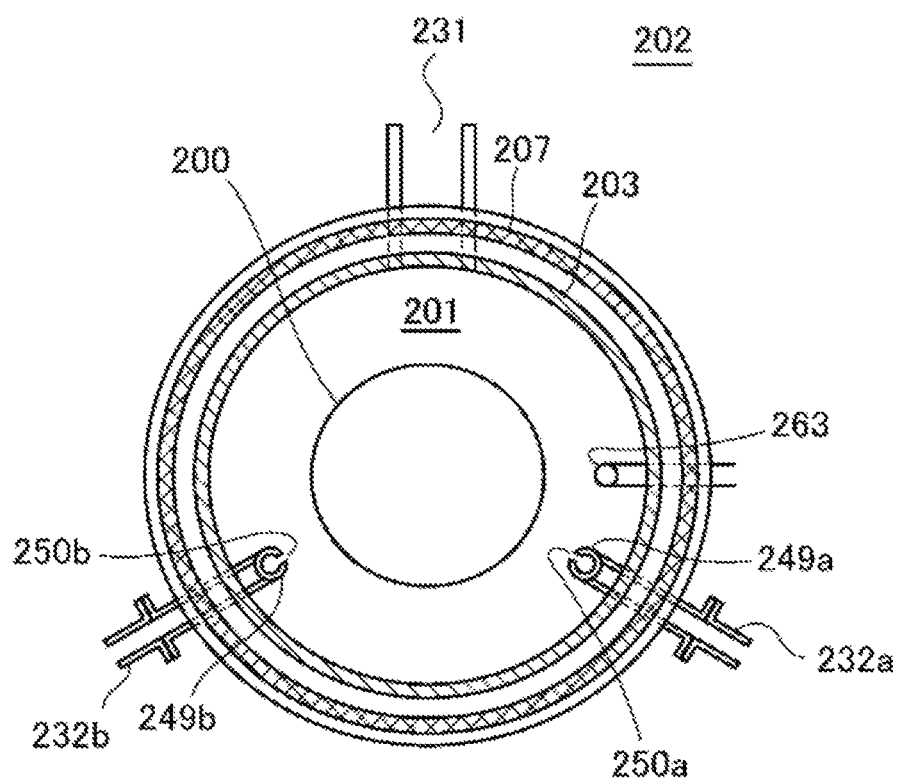
FIG. 2 is a schematic configuration diagram of a vertical type process furnace of the substrate processing apparatus suitably used in some embodiments of the present disclosure, in which a portion of the process furnace is shown in a cross sectional view taken along line A-A in FIG. 1.

As illustrated in FIG. 2, each of the nozzles 249a and 249b is disposed in a space with an annular shape (in a plane view) between an inner wall of the reaction tube 203 and the wafers 200 such that the nozzles 249a and 249b extend upward along an arrangement direction of the wafers 200 from a lower portion of the inner wall of the reaction tube 203 to an upper portion of the inner wall of the reaction tube 203. Specifically, each of the nozzles 249a and 249b is installed at a lateral side of a wafer arrangement region in which the wafers 200 are arranged, namely in a region which horizontally surrounds the wafer arrangement region, along the wafer arrangement region. Gas supply holes 250a and 250b for supplying gas are installed on side surfaces of the nozzles 249a and 249b, respectively. Each of the gas supply holes 250a and 250b is opened toward the center of the wafers 200 in a plan view, to allow the gas to be supplied toward the wafers 200. The gas supply holes 250a and 250b may be installed in a plural number between the lower portion of the reaction tube 203 and the upper portion of the reaction tube 203.

Precursor gas, for example, halosilane-based gas which contains silicon (Si) as a main element (predetermined element) constituting a film and a halogen element, is supplied from the gas supply pipe 232a into the process chamber 201 via the MFC 241a, the valve 243a, and the nozzle 249a. The precursor gas refers to a gaseous precursor, for example, gas obtained by vaporizing a precursor which remains in a liquid state under a room temperature and an atmospheric pressure, or a precursor which remains in a gas state under a room temperature and an atmospheric pressure. The halosilane refers to a silane containing a halogen element. The halogen element includes chlorine (Cl), fluorine (F), bromine (Br), iodine (I), and the like. As the halosilane-based gas, it may be possible to use, for example, precursor gas including Si and Cl, i.e., chlorosilane-based gas. As the chlorosilane-based gas, it may be possible to use, for example, hexachlorodisilane ($Si_2Cl_6$, abbreviation: HCDS) gas. The HCDS gas acts as a Si source.

Nitrogen (N)-and-carbon (C)-containing gas, which is one of the N-containing gases, as reaction gas, is supplied from the gas supply pipe 232b into the process chamber 201 via the MFC 241b, the valve 243b, and the nozzle 249b. As the N-and-C-containing gas, it may be possible to use, for example, triethylamine ($(C_2H_5)_3N$, abbreviation: TEA) gas which is amine-based gas. The TEA gas acts as a N source and a C source.

Oxygen (O)-containing gas as the reaction gas is supplied from the gas supply pipe 232c into the process chamber 201 via the MFC 241c, the valve 243c, the gas supply pipe 232b, and the nozzle 249b. As the O-containing gas, it may be possible to use, for example, oxygen ($O_2$) gas. The $O_2$ gas acts as an oxidizing gas, i.e., an O source.

N-and-hydrogen (H)-containing gas, which is one of the N-containing gases, as the reaction gas is supplied from the gas supply pipe 232d into the process chamber 201 via the MFC 241d, the valve 243d, the gas supply pipe 232b, and the nozzle 249b. As the N-and-H-containing gas, it may be possible to use, for example, ammonia ($NH_3$) gas which is hydrogen nitride-based gas. The $NH_3$ gas acts as a nitriding gas, i.e., a N source.

Carbon (C)-containing gas as the reaction gas is supplied from the gas supply pipe 232e into the process chamber 201 via the MFC 241e, the valve 243e, the gas supply pipe 232b, and the nozzle 249b. As the C-containing gas, it may be possible to use, for example, propylene ($C_3H_6$) gas which is hydrocarbon-based gas. The $C_3H_6$ gas acts as a C source. In addition, the gas supply pipe 232e, the MFC 241e, the valve 243e, and the like are used when the $C_3H_6$ gas is used in other embodiments as described hereinbelow.

Inert gas, for example, nitrogen ($N_2$) gas, is supplied from the gas supply pipes 232f and 232g into the process chamber 201 via the MFCs 241f and 241g, the valves 243f and 243g, the gas supply pipes 232a and 232b, and the nozzles 249a and 249b. The $N_2$ gas acts as a purge gas, carrier gas, dilution gas, or the like.

A precursor gas supply system (a Si source supply system) mainly includes the gas supply pipe 232a, the MFC 241a, and the valve 243a. A reaction gas supply system (a N and C source supply system, an O source supply system, a N source supply system, or a C source supply system) mainly includes the gas supply pipes 232b to 232e, the MFCs 241b to 241e, and the valves 243b to 243e. An inert gas supply system mainly includes the gas supply pipes 232f and 232g, the MFCs 241f and 241g, and the valves 243f and 243g.

The precursor gas and the reaction gas used in first film formation as described hereinbelow may be generally referred to as a first process gas. In addition, the precursor gas supply system and the reaction gas supply system used in the first film formation may be generally referred to as a first process gas supply system. Furthermore, the precursor gas and the reaction gas used in second film formation as described hereinbelow may be generally referred to as a second process gas. In addition, the precursor gas supply system and the reaction gas supply system used in the second film formation may be generally referred to as a second process gas supply system.

One or all of various supply systems described above may be configured as an integrated-type supply system 248 in which the valves 243a to 243g, the MFCs 241a to 241g, and the like are integrated. The integrated-type supply system 248 is connected to each of the gas supply pipes 232a to 232g so that a supply operation of various kinds of gases into the gas supply pipes 232a to 232g, i.e., an opening/closing operation of the valves 243a to 243g, a flow rate adjustment operation by the MFCs 241a to 241g or the like, is controlled by a controller 121 which will be described later. The integrated-type supply system 248 is configured as an integral type or detachable-type integrated unit, and may be attached to and detached from the gas supply pipes 232a to 232g or the like, to perform maintenance, replacement, expansion, or the like of the integrated-type supply system 248, on an integrated unit basis.

An exhaust port 231a configured to exhaust an internal atmosphere of the process chamber 201 is installed below a sidewall of the reaction tube 203. The exhaust port 231a may be installed to extend from a lower portion of the sidewall of the reaction tube 203 to its upper portion, i.e., along the wafer arrangement region. An exhaust pipe 231 is connected to the exhaust port 231a. A vacuum pump 246 as a vacuum exhaust device is connected to the exhaust pipe 231 via a pressure sensor 245 as a pressure detector (pressure detection part) which detects an internal pressure of the process chamber 201 and an auto pressure controller (APC) valve 244 as a pressure regulator (pressure regulation part). The APC valve 244 is configured to perform or stop a vacuum exhaust of the interior of the process chamber 201 by opening or closing the APC valve 244 while operating the vacuum pump 246 and so that the internal pressure of the process chamber 201 can be adjusted by adjusting an opening degree of the APC valve 244 based on pressure information detected by the pressure sensor 245 while operating the vacuum pump 246. An exhaust system mainly includes the exhaust pipe 231, the APC valve 244 and the pressure sensor 245. The exhaust system may include the vacuum pump 246.

A seal cap 219, which serves as a furnace opening cover configured to hermetically seal a lower end opening of the manifold 209, is installed under the manifold 209. The seal cap 219 is made of a metal material such as, e.g., stainless steel (SUS) or the like, and is formed in a disc shape. An O-ring 220b, which is a seal member making contact with the lower end portion of the manifold 209, is installed on an upper surface of the seal cap 219. A rotation mechanism 267 configured to rotate a boat 217, which will be described later, is installed under the seal cap 219. A rotary shaft 255 of the rotation mechanism 267, which is made of a metal material such as stainless steel or the like and penetrates the seal cap 219, is connected to the boat 217. The rotation mechanism 267 is configured to rotate the wafers 200 by rotating the boat 217. The seal cap 219 is configured to be vertically moved up or down by a boat elevator 115 which is an elevator mechanism installed outside the reaction tube 203. The boat elevator 115 is configured as a transfer system (transfer mechanism) which loads or unloads (transfers) the wafers 200 into or from (out of) the process chamber 201 by moving the seal cap 219 up or down.

A shutter 219s as a furnace opening cover capable of hermetically seal the lower end opening of the manifold 209 while moving the seal cap 219 down to unload the boat 217 from the interior of the process chamber 201 is installed under the manifold 209. The shutter 219s is made of a metal material such as, e.g., stainless steel (SUS) or the like, and is formed in a disc shape. An O-ring 220c as a seal member making contact with the lower end portion of the manifold 209 is installed on an upper surface of the shutter 219s. An opening/closing operation (such as an up/down movement operation, a rotational movement operation, or the like) of the shutter 219s is controlled by a shutter-opening/closing mechanism 115s.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. As such, the boat 217 is configured to arrange the wafers 200 to be spaced apart from each other. The boat 217 is made of a heat resistant material such as quartz or SiC. Heat-insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. The temperature sensor 263 is installed along the inner wall of the reaction tube 203.

Figure 3:
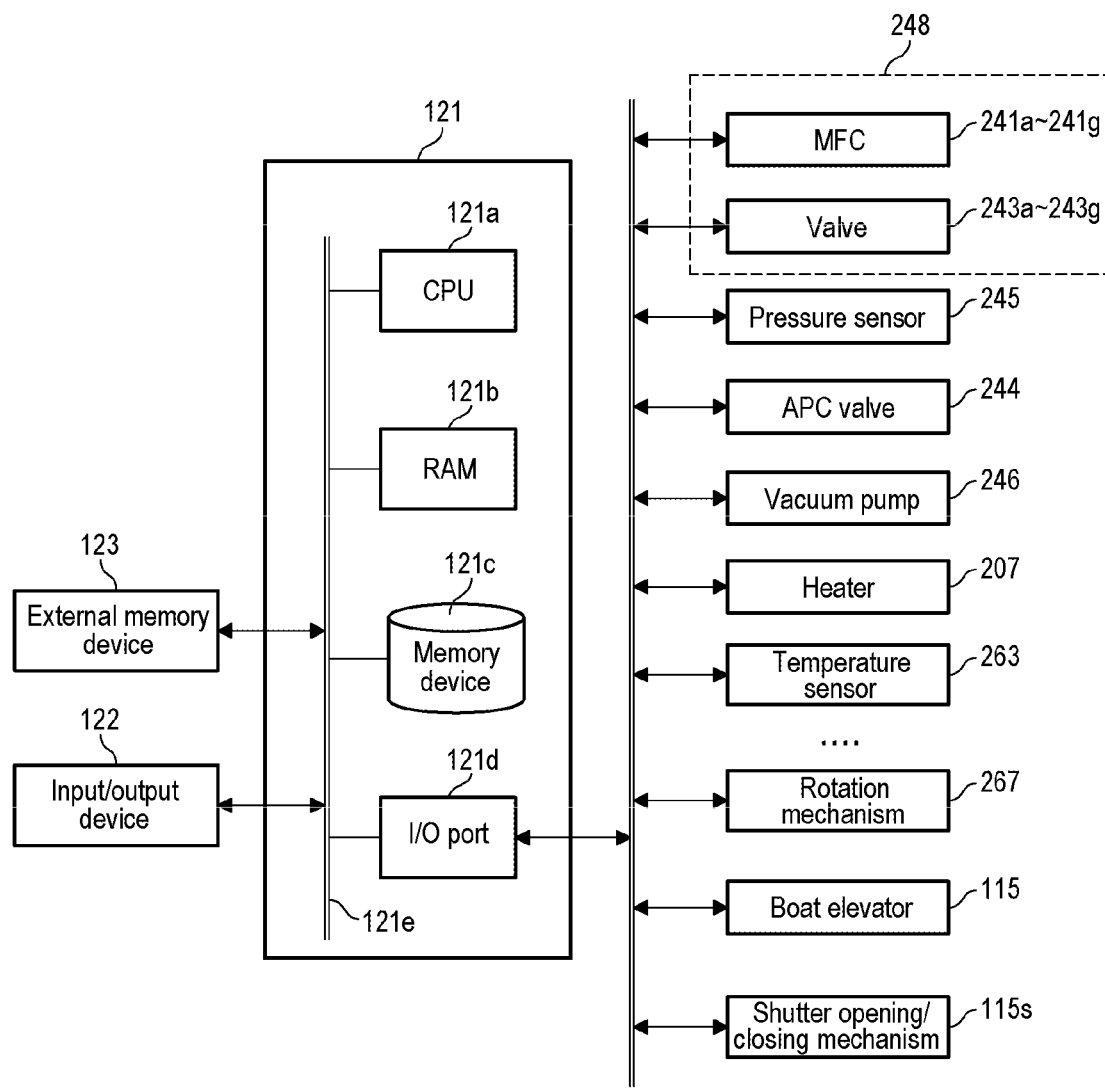
FIG. 3 is a schematic configuration diagram of a controller of the substrate processing apparatus suitably used in some embodiments of the present disclosure, in which a control system of the controller is shown in a block diagram.

As illustrated in FIG. 3, the controller 121, which is a control part (control means), may be configured as a computer including a central processing unit (CPU) 121a, a random access memory (RAM) 121b, a memory device 121c, and an I/O port 121d. The RAM 121b, the memory device 121c, and the I/O port 121d are configured to exchange data with the CPU 121a via an internal bus 121e. An input/output device 122 including, e.g., a touch panel or the like, is connected to the controller 121.

The memory device 121c includes, for example, a flash memory, a hard disk drive (HDD), or the like. A control program for controlling operations of a substrate processing apparatus, a process recipe for specifying sequences and conditions of substrate processing as described hereinbelow, or the like is readably stored in the memory device 121c. The process recipe functions as a program for causing the controller 121 to execute each sequence in the substrate processing, as described hereinbelow, to obtain a predetermined result. Hereinafter, the control program and the process recipe may be generally and simply referred to as a "program." Furthermore, the process recipe may be simply referred to as a "recipe." When the term "program" is used herein, it may indicate a case of including the recipe, a case of including the control program, or a case of including both the recipe and the control program. The RAM 121b is configured as a memory area (work area) in which a program, data, and the like read by the CPU 121a is temporarily stored.

The I/O port 121d is connected to the MFCs 241a to 241g, the valves 243a to 243g, the pressure sensor 245, the APC valve 244, the vacuum pump 246, the temperature sensor 263, the heater 207, the rotation mechanism 267, the boat elevator 115, the shutter-opening/closing mechanism 115s, and the like, as described above.

The CPU 121a is configured to read and execute the control program from the memory device 121c. The CPU 121a is also configured to read the recipe from the memory device 121c according to an input and so on of an operation command from the input/output device 122. In addition, the CPU 121a is configured to control, according to the contents of the read recipe, the flow-rate-adjusting operation of various kinds of gases by the MFCs 241a to 241g, the opening/closing operation of the valves 243a to 243g, the opening/closing operation of the APC valve 244, the pressure-regulating operation performed by the APC valve 244 based on the pressure sensor 245, the driving or stopping of the vacuum pump 246, the temperature-adjusting operation performed by the heater 207 based on the temperature sensor 263, the operation of rotating the boat 217 with the rotation mechanism 267 and adjusting the rotation speed of the boat 217, the operation of moving the boat 217 up or down by the boat elevator 115, the operation of opening or closing the shutter 219s by the shutter-opening/closing mechanism 115s, and the like.

The controller 121 may be configured by installing, on the computer, the aforementioned program stored in an external memory device 123. The external memory device 123 may include, for example, a magnetic disc such as an HDD, an optical disc such as a CD, a magneto-optical disc such as an MO, a semiconductor memory such as a USB memory, and the like. The memory device 121c or the external memory device 123 is configured as a non-transitory computer-readable recording medium. Hereinafter, the memory device 121c and/or the external memory device 123 may be generally and simply referred to as a "recording medium." When the term "recording medium" is used herein, it may indicate a case of including the memory device 121c, a case of including the external memory device 123, or a case of including both the memory device 121c and the external memory device 123. Furthermore, the program may be provided to the computer using a communication means such as the Internet or a dedicated line, instead of using the external memory device 123.

(2) Substrate Processing

As a process of manufacturing a semiconductor device using the aforementioned substrate processing apparatus, one or more examples of substrate processing sequence of forming a low-dielectric-constant film on a wafer 200 as a substrate with an underlayer of at least one selected from the group of a conductive metal-element-containing film (hereinafter, simply referred to as a metal-containing film) and a nitride film exposed on its surface, while suppressing oxidation of the underlayer will be mainly described with reference to FIGS. 4, 5 and 6A to 6C. In the following descriptions, the operations of the respective parts constituting the substrate processing apparatus are controlled by the controller 121.

In the substrate processing sequence according to the present embodiments, there are performed: forming a silicon carbonitride film (SiCN film) as a first film containing Si, C, and N and not containing O with a first thickness on an underlayer of at least one (here, both) selected from the group of a tungsten film (W film) as a conductive metal-element-containing film and a silicon nitride film (SiN film) as a nitride film by supplying HCDS gas and TEA gas as a first process gas not including oxidizing gas to a wafer 200 in which the underlayer is exposed on its surface (first film formation); and forming a silicon oxycarbonitride film (SiOCN film), which is a film containing Si, O, C, and N, as a second film containing Si, O, and N on the SiCN film with a second thickness larger than the first thickness by supplying HCDS gas, TEA gas, and $O_2$ gas as a second process gas including oxidizing gas to the wafer 200 (second film formation), wherein O atoms, which are derived from the oxidizing gas and diffuse from the surface of the SiCN film toward the underlayer, are absorbed by the SiCN film and the SiCN film is modified in the second film formation.

Figure 4:
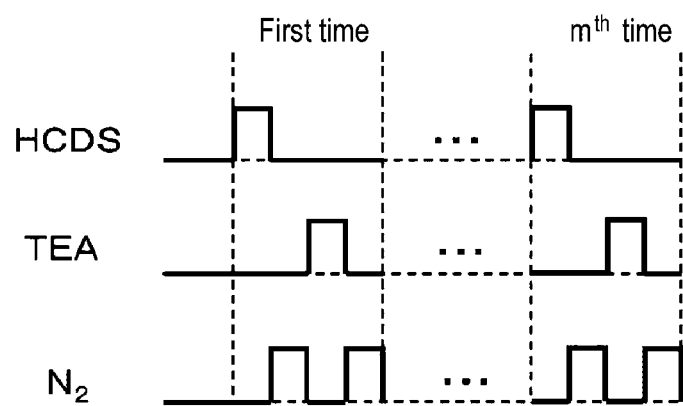
FIG. 4 is a diagram illustrating a gas supply sequence in first film formation according to some embodiments of the present disclosure.

Furthermore, in the first film formation described above, a cycle including supplying the HCDS gas and the TEA gas to the wafer 200 is performed a predetermined number of times. A gas supply sequence illustrated in FIG. 4 shows a sequence example in which a cycle including intermittently and non-simultaneously supplying the HCDS gas and the TEA gas to the wafer 200 is performed m times (where m is an integer in a range of 1 to 3) in the first film formation.

Figure 5:
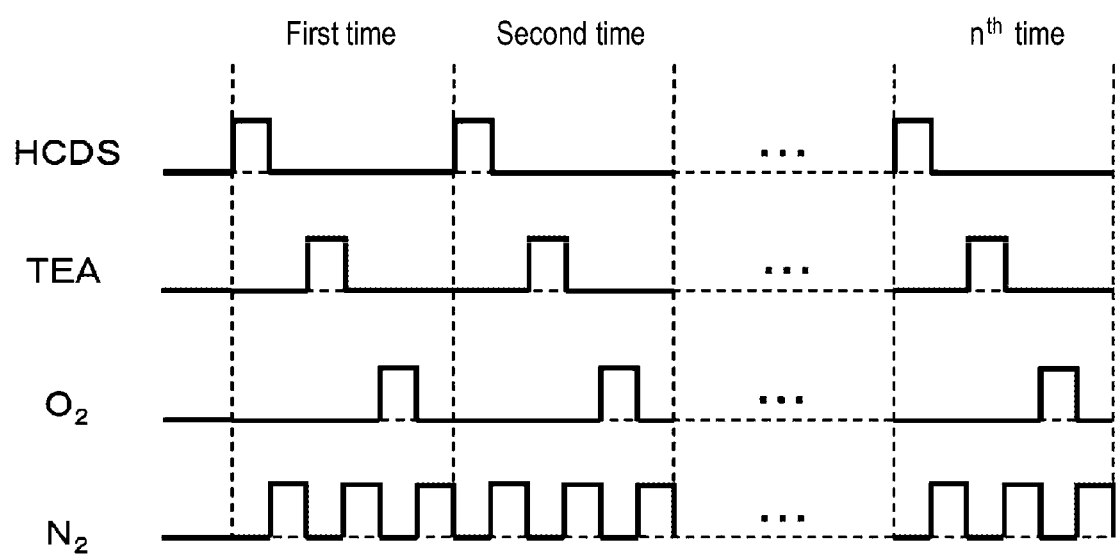
FIG. 5 is a diagram illustrating a gas supply sequence in second film formation according to some embodiments of the present disclosure.

In addition, in the second film formation described above, a cycle including supplying the HCDS gas, the TEA gas, and the $O_2$ gas to the wafer 200 is performed a predetermined number of times. A gas supply sequence illustrated in FIG. 5 shows a sequence example in which a cycle including intermittently and non-simultaneously supplying the HCDS gas, the TEA gas, and the $O_2$ gas to the wafer 200 is performed n times (where n is an integer of 1 or more) in the second film formation.

In the present disclosure, for the sake of convenience, the gas supply sequence of the first film formation illustrated in FIG. 4 and the gas supply sequence of the second film formation illustrated in FIG. 5 may be denoted as follows. The same denotation may be used in other embodiments as described hereinbelow.

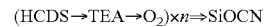

When the term "wafer" is used herein, it may refer to a wafer itself or a laminated body of a wafer and a predetermined layer or film formed on the surface of the wafer. In addition, when the phrase "a surface of a wafer" is used herein, it may refer to a surface of a wafer itself or a surface of a predetermined layer or the like formed on a wafer. Furthermore, in the present disclosure, the expression "a predetermined layer is formed on a wafer" may mean that a predetermined layer is directly formed on a surface of a wafer itself or that a predetermined layer is formed on a layer or the like formed on a wafer. In addition, when the term "substrate" is used herein, it may be synonymous with the term "wafer."

(Wafer Charging and Boat Loading)

When a plurality of wafers 200 is charged on the boat 217 (wafer charging), the shutter 219s is moved by the shutter-opening/closing mechanism 115s to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 through the O-ring 220b.

Figure 6A:
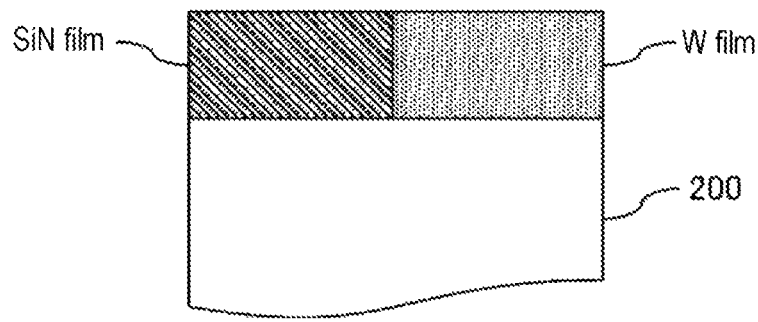
FIG. 6A is a partial enlarged cross sectional view of a surface of a target wafer in which each of a W film and a SiN film is exposed on the surface.

As the wafers 200, for example, a Si substrate made of single crystal Si or a substrate on which a single crystal Si film is formed on its surface, may be used. As illustrated in FIG. 6A, a W film, which is a conductive metal-element-containing film, and a SiN film, which is a nitride film, are each installed in advance as an underlayer on at least a portion of a surface of a wafer 200. At least a portion of the W film and at least a portion of the SiN film are each exposed.

(Pressure Regulation and Temperature Adjustment)

The interior of the process chamber 201, namely the space in which the wafers 200 are located, is vacuum-exhausted (depressurization-exhausted) by the vacuum pump 246 to reach a desired pressure (degree of vacuum). In this operation, the internal pressure of the process chamber 201 is measured by the pressure sensor 245. The APC valve 244 is feedback-controlled based on the measured pressure information (pressure regulation). Furthermore, the wafers 200 in the process chamber 201 are heated by the heater 207 to a desired temperature. In this operation, the degree of supplying electric power to the heater 207 is feedback-controlled based on the temperature information detected by the temperature sensor 263 such that the interior of the process chamber 201 has a desired temperature distribution (temperature adjustment). In addition, the rotation of the boat 217 and the wafers 200 by the rotation mechanism 267 begins. The operation of the vacuum pump 246 and the heating and rotation of the wafers 200 may be continuously performed at least until the processing of the wafers 200 is completed.

(First Film Formation)

Thereafter, the following steps A1 and A2 are sequentially performed.

[Step A1]

In this operation, HCDS gas is supplied to the wafer 200 in the process chamber 201 (HCDS gas supply). Specifically, the valve 243a is opened to allow the HCDS gas to flow through the gas supply pipe 232a. The flow rate of the HCDS gas is adjusted by the MFC 241a. The HCDS gas is supplied into the process chamber 201 via the nozzle 249a and is exhausted through the exhaust port 231a. In this operation, the HCDS gas is supplied to the wafer 200. Simultaneously, the valves 243f and 243g may be opened to supply $N_2$ gas into the process chamber 201 via the nozzles 249a and 249b.

The processing condition in this step may be exemplified as follows:

HCDS gas supply flow rate: 0.01 to 2 slm or 0.1 to 1 slm in some embodiments $N_2$ gas supply flow rate (per gas supply pipe): 0 to 10 slm Supply time of each gas: 1 to 120 seconds or 1 to 60 seconds in some embodiments Processing temperature: 400 to 800 degrees C. or 600 to 700 degrees C. in some embodiments Processing pressure: 1 to 2,666 Pa or 67 to 1,333 Pa in some embodiments.

Furthermore, in the present disclosure, the expression of the numerical range such as "1 to 2,666 Pa" may mean that a lower limit value and an upper limit value are included in that range. For example, "1 to 2,666 Pa" may mean "1 Pa or higher and 2,666 Pa or lower." The same applies to other numerical ranges.

By supplying the HCDS gas to the wafer 200 under the aforementioned condition, a Si-containing layer containing Cl is formed on the outermost surface of the wafer 200. The Si-containing layer containing Cl is formed by physical adsorption or chemical adsorption of HCDS or chemical adsorption of a substance (hereinafter, $Si_xCl_y$) obtained by partially decomposing HCDS to the outermost surface of the wafer 200, deposition of Si by thermal decomposition of HCDS thereon, or the like. The Si-containing layer containing Cl may be an adsorption layer (a physical adsorption layer or a chemical adsorption layer) of HCDS or $Si_xCl_y$, or may be a deposited layer of Si containing Cl. In the present disclosure, the Si-containing layer containing Cl may be simply referred to as a Si-containing layer.

After the Si-containing layer is formed, the valve 243a is closed to stop the supply of the HCDS gas into the process chamber 201. Then, the interior of the process chamber 201 is vacuum-exhausted and the gas or the like remaining in the process chamber 201 is removed from the interior of the process chamber 201 (purge). In this operation, the valves 243f and 243g are opened to supply $N_2$ gas into the process chamber 201. The $N_2$ gas acts as a purge gas.

As the precursor gas, it may be possible to use, chlorosilane-based gas such as monochlorosilane ($SiH_3Cl$, abbreviation: MCS) gas, dichlorosilane ($SiH_2Cl_2$, abbreviation: DCS) gas, trichlorosilane ($SiHCl_3$, abbreviation: TCS) gas, tetrachlorosilane ($SiCl_4$, abbreviation: STC) gas, octachlorotrisilane ($Si_3Cl_8$, abbreviation: OCTS) gas, or the like, fluorosilane-based gas such as tetrafluorosilane ($SiF_4$) gas or the like, bromosilane-based gas such as tetrabromosilane ($SiBr_4$) gas or the like, or iodosilane-based gas such as tetraiodosilane ($SiI_4$) gas or the like, as well as the HCDS gas. This also applies to B1 or the like as described hereinbelow.

As the inert gas, it may be possible to use, rare gas such as Ar gas, He gas, Ne gas, Xe gas, or the like, as well as the $N_2$ gas. This also applies to each step as described hereinbelow.

[Step A2]

After A1 is completed, TEA gas is supplied to the wafer 200 in the process chamber 201, namely to the Si-containing layer formed on the wafer 200 (TEA gas supply). Specifically, the valve 243b is opened to allow the TEA gas to flow through the gas supply pipe 232b. The flow rate of the TEA gas is adjusted by the MFC 241b. The TEA gas is supplied into the process chamber 201 via the nozzle 249b and is exhausted through the exhaust port 231a. In this operation, the TEA gas is supplied to the wafer 200. Simultaneously, the valves 243f and 243g may be opened to supply $N_2$ gas into the process chamber 201 via the nozzles 249a and 249b.

The processing condition in this step may be exemplified as follows:

TEA gas supply flow rate: 0.1 to 10 slm

Supply time of TEA gas: 1 to 120 seconds or 1 to 60 seconds in some embodiments

Processing pressure: 1 to 4,000 Pa or 1 to 3,000 Pa in some embodiments.

Other processing conditions may be similar to the processing conditions of A1.

By supplying the TEA gas to the wafer 200 under the aforementioned conditions, the Si-containing layer can be modified by introducing each of N component and C component contained in the TEA gas into the Si-containing layer by the reaction between the TEA gas and the Si-containing layer formed on the wafer 200. As a result, a silicon carbonitride layer (SiCN layer) as a layer containing Si, C, and N and not containing O is formed on the wafer 200. Furthermore, in this operation, the amount of C component added into the SiCN layer may be increased, for example, more than the amount of N component added into the SiCN layer, by using the TEA gas which is amine-based gas as the reaction gas. As a result, it is possible to make the C concentration in the SiCN layer higher than the N concentration in this layer.

When forming the SiCN layer, an impurity such as Cl contained in the Si-containing layer constitutes a gaseous substance containing at least Cl in the process of the modifying reaction of the Si-containing layer by the TEA gas and is exhausted from the interior of the process chamber 201. Thus, the SiCN layer becomes a layer having fewer impurities such as Cl than the Si-containing layer formed in A1.

After the SiCN layer is formed, the valve 243b is closed to stop the supply of the TEA gas into the process chamber 201. Then, the gas or the like, which remains in the process chamber 201, is removed from the interior of the process chamber 201 according to processing procedures similar to those of the purge in A1 (purge).

As the reaction gas (the N-and-C-containing gas), it may be possible to use, for example, ethylamine-based gas such as diethylamine (($C_2H_5)_2NH$, abbreviation: DEA) gas or monoethylamine ($C_2H_5NH_2$, abbreviation: MEA) gas, methylamine-based gas such as trimethylamine (($CH_3)_3N$, abbreviation: TMA) gas, dimethylamine (($CH_3$)$_2$NH, abbreviation: DMA) gas, monomethylamine ($CH_3NH_2$, abbreviation: MMA) gas, or the like, as well as the TEA gas. Furthermore, as the N-and-C-containing gas, it may be possible to use, organic hydrazine-based gas such as trimethylhydrazine (($CH_3$)$_2$N$_2$($CH_3$)H, abbreviation: TMH) gas, dimethylhydrazine (($CH_3$)$_2$N$_2$H$_2$, abbreviation: DMH) gas, monomethylhydrazine (($CH_3$)HN$_2$H$_2$, abbreviation: MMH) gas, or the like, as well as the amine-based gas. This also applies to B2 or the like as described hereinbelow.

[Performing a Predetermined Number of Times]

Figure 6B:
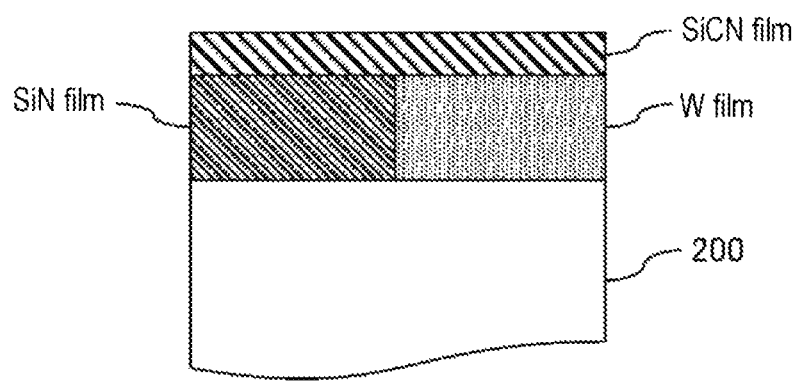
FIG. 6B is a partial enlarged cross sectional view of the surface of the wafer after a SiCN film is formed on each of the W film and the SiN film by performing the first film formation.

A cycle which non-simultaneously, i.e., non-synchronously, performs A1 and A2 described above is performed a predetermined number of times (m times, where m is an integer in a range of 1 to 3), whereby a SiCN film having a predetermined composition and a predetermined thickness can be formed on the wafer 200, namely on each of the W film and the SiN film exposed on the surface of the wafer 200, as illustrated in FIG. 6B.

As described above, in the first film formation, the C concentration in the SiCN film formed on the wafer 200 can be set higher than the N concentration in this film. When the first film formation is completed, the C concentration in the SiCN film can be set to a predetermined concentration, for example, in a range of 30 to 50 at %. By increasing the C concentration in the SiCN film, it is possible to appropriately achieve an oxidation blocking effect as described hereinbelow.

Furthermore, if the C concentration in the SiCN film is less than 30 at %, there may be a case where an O atom trapping effect as described hereinbelow becomes insufficient and the oxidation blocking effect as described hereinbelow becomes insufficient, causing oxidation of a portion of the underlayer (the W film or the SiN film) in the second film formation as described hereinbelow. By setting the C concentration in the SiCN film to 30 at % or higher, the O atom trapping effect can be sufficiently achieved and the oxidation blocking effect can be sufficiently achieved, avoiding the oxidation of the underlayer in the second film formation.

In addition, if the C concentration in the SiCN film is more than 50 at %, there may be a case where the amount of C remaining in the modified SiCN film (the SiOCN film or the SiON film) is increased in the second film formation as described hereinbelow, which increases leak current. By setting the C concentration in the SiCN film to 50 at % or lower, it is possible to reduce the amount of C remaining in the modified SiCN film (the SiOCN film or the SiON film) and to suppress the leak current.

The thickness of the SiCN film (first thickness) is set at a thickness in a range of, for example, 0.05 nm to 0.15 nm.

If the thickness of the SiCN film is smaller than 0.05 nm, there may be a case where the oxidation blocking effect as described hereinbelow becomes insufficient, causing oxidation of a portion of the underlayer (the W film or the SiN film) in the second film formation as described hereinbelow. By setting the thickness of the SiCN film at 0.05 nm or larger, the oxidation blocking effect can be sufficiently achieved, avoiding the oxidation of the underlayer in the second film formation.

If the thickness of the SiCN film is larger than 0.15 nm, a total dielectric constant of a laminated film as described hereinbelow may be increased. By setting the thickness of the SiCN film at 0.15 nm or smaller, it is possible to suppress an increase in the total dielectric constant of the laminated film as described hereinbelow.

The aforementioned cycle may be repeated multiple times. That is, the thickness of the SiCN layer formed per one cycle may be set to be smaller than a desired thickness, and the aforementioned cycle may be repeated multiple times until the thickness of the SiCN film formed by laminating the SiCN layer becomes equal to the desired thickness. By setting the number of times of performing the aforementioned cycle to a predetermined number in a range of 1 to 3, the thickness of the SiCN film may have a thickness in the aforementioned range.

(Second Film Formation)

Thereafter, the following steps B1 to B3 are sequentially performed.

[Step B1]

In this operation, HCDS gas is supplied to the wafer 200 in the process chamber 201 according to processing procedures and processing conditions similar to those of A1 described above (HCDS gas supply). Thus, a Si-containing layer is formed on the wafer 200, namely on the SiCN film formed on the wafer 200. After the Si-containing layer is formed, the supply of the HCDS gas into the process chamber 201 is stopped, and the gas or the like remaining in the process chamber 201 is removed from the interior of the process chamber 201 according to processing procedures similar to those of the purge in A1 (purge).

[Step B2]

After B1 is completed, TEA gas is supplied to the wafer 200 in the process chamber 201 according to processing procedures and the processing conditions similar to those of A2 described above (TEA gas supply). Thus, the Si-containing layer formed in B1 is modified by the TEA gas to form a SiCN layer on the wafer 200, namely on the SiCN film formed on the wafer 200. After the SiCN layer is formed, the supply of the TEA gas into the process chamber 201 is stopped, and the gas or the like remaining in the process chamber 201 is removed from the interior of the process chamber 201 according to processing procedures similar to those of the purge in A1 (purge).

[Step B3]

After B2 is completed, $O_2$ gas is supplied to the wafer 200 in the process chamber 201, namely to the SiCN layer formed on the SiCN film on the wafer 200 ($O_2$ gas supply). Specifically, the valve 243c is opened to allow the $O_2$ gas to flow through the gas supply pipe 232c. The flow rate of the $O_2$ gas is adjusted by the MFC 241c. The $O_2$ gas is supplied into the process chamber 201 via the gas supply pipe 232b and the nozzle 249b and is exhausted through the exhaust port 231a. In this operation, the $O_2$ gas is supplied to the wafer 200. Simultaneously, the valves 243f and 243g may be opened to supply $N_2$ gas into the process chamber 201 via the nozzles 249a and 249b.

The processing condition in this step may be exemplified as follows:

$O_2$ gas supply flow rate: 0.1 to 10 slm

Supply time of $O_2$ gas: 1 to 120 seconds or 1 to 60 seconds in some embodiments Processing pressure: 1 to 4,000 Pa or 1 to 3,000 Pa in some embodiments.

The other processing conditions may be similar to the processing conditions of A1.

By supplying the $O_2$ gas to the wafer 200 under the aforementioned conditions, at least a portion of the SiCN layer formed on the SiCN film on the wafer 200 is oxidized (modified). As a result, a silicon oxycarbonitride layer (SiOCN layer) which is a layer containing Si, O, C, and N as a layer containing Si, O, and N is formed on the wafer 200, namely on the SiCN film formed on the wafer 200.

When forming the SiOCN layer, an impurity such as Cl contained in the SiCN layer constitutes a gaseous substance containing at least Cl in the process of the modifying reaction of the SiCN layer by the $O_2$ gas and is exhausted from the interior of the process chamber 201. Thus, the SiOCN layer becomes a layer having fewer impurities such as Cl than the Si-containing layer formed in B1 or the SiCN layer formed in B2.

After the SiOCN layer is formed, the valve 243c is closed to stop the supply of the $O_2$ gas into the process chamber 201. Then, the gas or the like, which remains in the process chamber 201, is removed from the interior of the process chamber 201 according to processing procedures similar to those of the purge in A1 (purge).

As the reaction gas (the O-containing gas), it may be possible to use, for example, ozone ($O_3$) gas, water vapor ($H_2O$ gas), nitrogen monoxide (NO) gas, nitrous oxide ($N_2O$) gas, or the like, as well as the $O_2$ gas.

[Performing a Predetermined Number of Times]

A cycle which non-simultaneously, i.e., non-synchronously, performs B1 to B3 described above is performed a predetermined number of times (n times, where n is an integer of 1 or more), whereby a SiOCN film having a predetermined composition and a predetermined thickness can be formed on the wafer 200, namely on the SiCN film formed on the wafer 200 by performing the first film formation.

Furthermore, in the process of forming the SiOCN film in the second film formation, O atoms derived from the oxidizing gas (here, $O_2$ gas), for example, a portion of the O component contained in the oxidizing gas supplied to the wafer 200 or a portion of the O component contained in the SiOCN layer formed on the wafer 200 can also be supplied to the SiCN film which is the underlayer of the second film formation. Thus, the SiCN film can be modified (oxidized) into a SiOCN film having a lower dielectric constant than the SiCN film by substituting at least a portion of C atoms contained in the SiCN film, which is the underlayer of the second film formation, with O atoms, and then by diffusing the O component to be added into this film. In this operation, the SiCN film may be modified into a SiOCN film having an O concentration higher than a N concentration depending on the conditions. Furthermore, the SiCN film may be modified into a silicon oxynitride film (SiON film) not containing C, and further into a SiON film having the O concentration higher than the N concentration depending on the conditions.

Figure 6C:
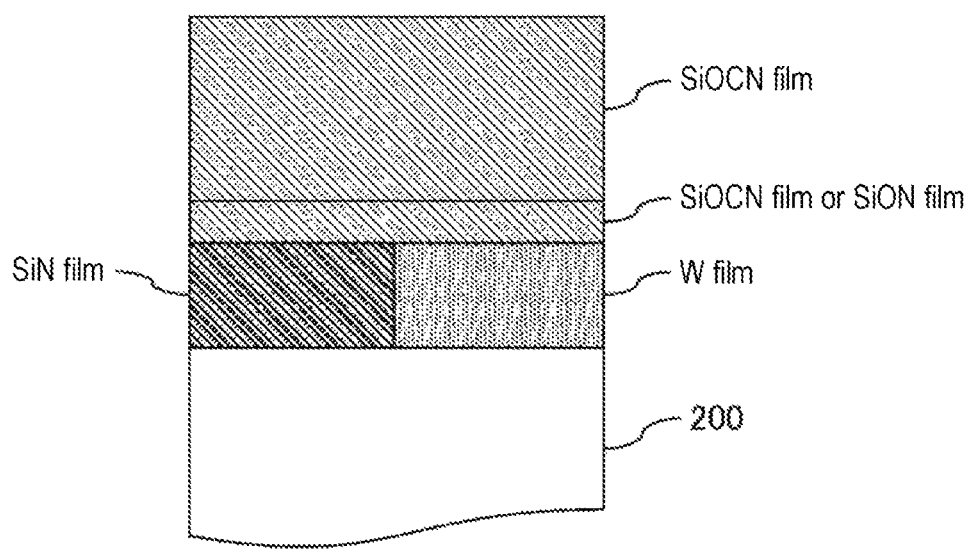
FIG. 6C is a partial enlarged cross sectional view of the surface of the wafer after a SiOCN film is formed on the SiCN film by performing the second film formation and the SiCN film formed by the first film formation is modified into a SiOCN film or a SiON film.

In addition, when the second film formation is completed in the second film formation, the entire SiCN film can be modified into the SiOCN film or the SiON film. Thus, as illustrated in FIG. 6C, a laminated film formed by sequentially laminating a first film (the SiOCN film or the SiON film) and a second film (the SiOCN film) which have low dielectric constants can be formed on the wafer 200, namely on each of the W film and the SiN film exposed on the wafer 200. This laminated film becomes a so-called low-dielectric-constant film (low-k film).

Furthermore, when performing the second film formation, the O atoms (O component) which are derived from the oxidizing gas and tend to diffuse to the underlayer side (the W film side or the SiN film side) when forming the SiCN film, i.e., the laminated film, are trapped and blocked from diffusing to the underlayer side because the SiCN film itself is oxidized. By limiting the diffusion of the O component to the underlayer side by the SiCN film in this way, it is possible to suppress the oxidation of each of the W film and the SiN film as the underlayer. In the present disclosure, the blocking effect of the O component diffusing to the underlayer achieved by the SiCN film, i.e., an oxidation suppression effect of the underlayer, may also be referred to as the oxidation blocking effect. Furthermore, as described above, in the first film formation, the C concentration can be set higher than the N concentration in the SiCN film. Thus, it is possible to enhance the O atom trapping effect by the SiCN film in the second film formation, to further enhance the oxidation blocking effect of the underlayer achieved in the second film formation, and to further suppress the oxidation of the underlayer.

Furthermore, the thickness of the SiOCN film formed by the second film formation (second thickness) may be set larger than the thickness of the SiCN film formed by the first film formation (first thickness). That is, the thickness of the SiCN film formed by the first film formation may be set smaller than the thickness of the SiOCN film formed by the second film formation. Thus, when performing the second film formation, the entire SiCN film formed by the first film formation can be oxidized and modified into the SiOCN film or the SiON film and the entire SiCN film formed by the first film formation can be modified into a low-dielectric-constant film. As a result, it is possible to lower the total dielectric constant of the laminated film formed by laminating the first film and the second film. In addition, it is possible to further lower an average dielectric constant of the laminated film by increasing the ratio of the thickness of the second film whose dielectric constant tends to be lower than the dielectric constant of the first film to the total thickness of the laminated film, i.e., by decreasing the ratio of the thickness of the first film whose dielectric constant tends to be higher than the dielectric constant of the second film.

The aforementioned cycle may be repeated multiple times. That is, the thickness of the SiOCN layer formed per one cycle may be set smaller than a desired thickness, and the aforementioned cycle may be repeated multiple times until the thickness of the SiOCN film formed by laminating the SiOCN layer becomes equal to the desired thickness.

(After-Purge and Atmospheric Pressure Return)

After the formation of the SiOCN film as the second film and the modification of the SiCN film formed as the first film into the SiOCN film or SiON film are completed, the $N_2$ gas as purge gas is supplied from each of the nozzles 249a and 249b into the process chamber 201 and is exhausted through the exhaust port 231a. Thus, the interior of the process chamber 201 is purged and the gas or the reaction byproduct, which remains in the process chamber 201, is removed from the interior of the process chamber 201 (after-purge). Thereafter, the internal atmosphere of the process chamber 201 is substituted with inert gas (inert gas substitution). The internal pressure of the process chamber 201 is returned to an atmospheric pressure (atmospheric pressure return).

(Boat Unloading and Wafer Discharging)

The seal cap 219 is moved down by the boat elevator 115 to open the lower end of the manifold 209. Then, the processed wafers 200 supported on the boat 217 are unloaded from the lower end of the manifold 209 to the outside of the reaction tube 203 (boat unloading). After the boat unloading, the shutter 219s is moved so that the lower end opening of the manifold 209 is sealed by the shutter 219s through the O-ring 220c (shutter closing). The processed wafers 200 are unloaded to the outside of the reaction tube 203 and are subsequently discharged from the boat 217 (wafer discharging).

(3) Effects According to the Present Embodiments

According to the present embodiments, one or more effects as set forth below may be achieved.

(a) By performing the first film formation before performing the second film formation, it is possible to block the O atoms (O component) which are derived from the oxidizing gas and tend to diffuse downward below the SiCN film, i.e., the O component which tends to reach the underlayer, when performing the second film formation. By the diffusion blocking action of the O component by the SiCN film, it is possible to suppress the oxidation of the underlayer. Furthermore, when the surface of the W film as the underlayer is oxidized, the resistance of the W film may be increased, but this problem can be avoided according to the present embodiments. Moreover, when the surface of the SiN film as the underlayer is oxidized, charge trapping characteristics of the SiN film may be deteriorated, but this problem can be avoided according to the present embodiments.

(b) In the first film formation, the C concentration can be set higher than the N concentration in the SiCN film, and thus, it is possible to further enhance the oxidation blocking effect of the underlayer achieved in the second film formation and to further suppress the oxidation of the underlayer.

(c) In the second film formation, the SiOCN film having a low dielectric constant can be formed on the wafer 200 by using the second process gas including the oxidizing gas. Furthermore, by performing the second film formation, the SiCN film formed by the first film formation can be oxidized and modified into the SiOCN film or the SiON film having a low dielectric constant. Thus, the laminated film formed by laminating the first film and the second film may become a low-dielectric-constant film.

(d) By setting the thickness of the SiOCN film formed by the second film formation larger than the thickness of the SiCN film formed by the first film formation, it is possible to promote the oxidation of the SiCN film and to further lower the dielectric constant of the laminated film formed by laminating the first film and the second film. Moreover, by increasing the ratio of the thickness of the second film whose dielectric constant tends to be lower than the dielectric constant of the first film to the total thickness of the laminated film, i.e., by decreasing the ratio of the thickness of the first film whose dielectric constant tends to be higher than the dielectric constant of the second film, it is possible to further lower the average dielectric constant of the laminated film.

(e) As described above, according to the present embodiments, it is possible to suppress the oxidation of the underlayer while allowing the oxide film (the laminated film of the first film and the second film) formed on the underlayer (the W film and the SiN film) to become a low-dielectric-constant film. The laminated film formed by the method of the present embodiments can be appropriately applied to, for example, a logic device such as an MPU, a hard mask, an etch stopper, or a sidewall spacer in a memory device such as a DRAM or a 3D NAND, or the like.

(f) By setting the temperature conditions in the first film formation and the second film formation identical, changing the temperature of the wafer 200 between the first film formation and the second film formation (temperature rising or temperature dropping) may not be prepared. Thus, it is possible to improve the throughput of substrate processing.

(g) The effects of the present embodiments can be similarly achieved in cases where precursor gas other than the HCDS gas is used, in cases where N-and-C-containing gas other than the TEA gas is used, in cases where O-containing gas other than the $O_2$ gas is used, or in cases where inert gas other than the $N_2$ gas is used.

Second Embodiments of the Present Disclosure

Second embodiments of the present disclosure will now be mainly described with reference to FIGS. 7A to 7C.

Figure 7A:
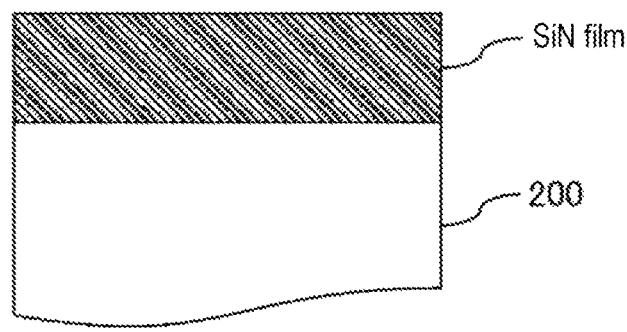
FIG. 7A is a partial enlarged cross sectional view of a surface of a target wafer in which a SiN film is exposed on the surface.
Figure 7B:
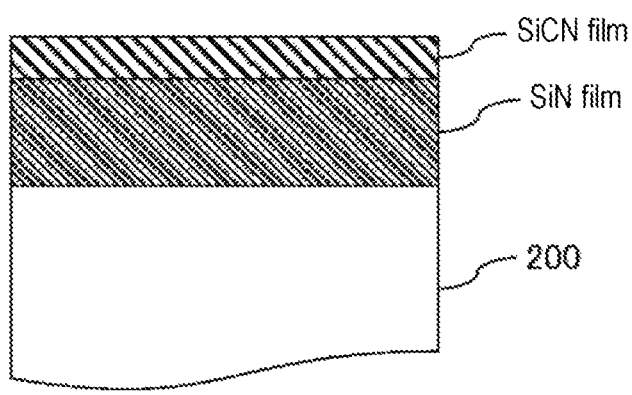
FIG. 7B is a partial enlarged cross sectional view of the surface of the wafer after a SiCN film is formed on the SiN film by performing the first film formation.
Figure 7C:
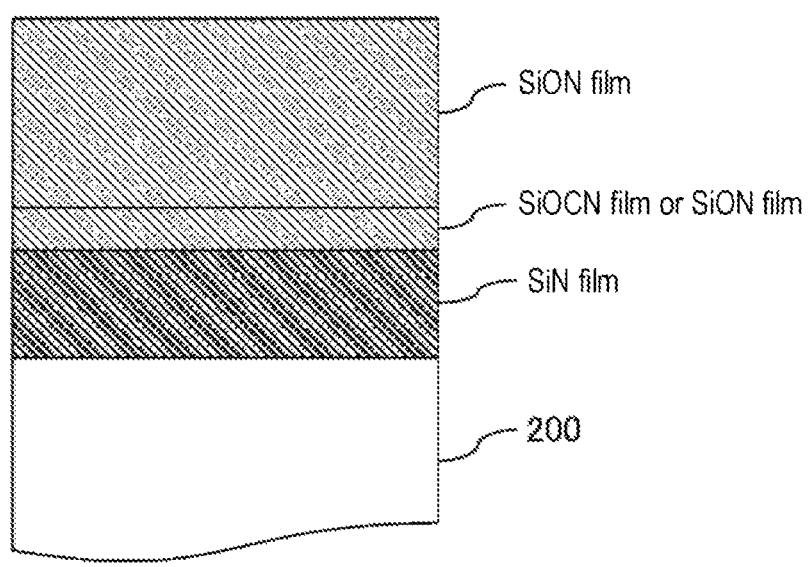
FIG. 7C is a partial enlarged cross sectional view of the surface of the wafer after a SiON film is formed on the SiCN film by performing the second film formation and the SiCN film formed by the first film formation is modified into a SiOCN film or a SiON film.

As illustrated in FIG. 7A, a SiN film, which is a nitride film, is installed in advance as an underlayer on at least a portion of a surface of a wafer 200 in the present embodiments. At least a portion of the SiN film is exposed on the surface of the wafer 200.

(First Film Formation)

The first film formation is performed in the same manner as the first film formation of the aforementioned embodiments, as in the film-forming sequence illustrated below. As a result, as illustrated in FIG. 7B, a SiCN film having a predetermined composition and a predetermined thickness is formed on the wafer 200, namely on the SiN film exposed on the surface of the wafer 200.

(HCDS→TEA)×m⇒SiCN (Second Film Formation)

In the second film formation, the following steps C1 to C3 are sequentially performed as in the film-forming sequence illustrated below.

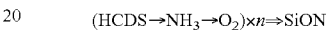
(HCDS→NH$_3$→O$_2$)×n⇒SiON

[Step C1]

In C1, HCDS gas is supplied to the wafer 200 in the process chamber 201 according to processing procedures and processing conditions similar to those of A1 described above (HCDS gas supply). Thus, a Si-containing layer is formed on the wafer 200, namely on the SiCN film formed on the wafer 200. After the Si-containing layer is formed, the supply of the HCDS gas into the process chamber 201 is stopped, and the gas or the like remaining in the process chamber 201 is removed from the interior of the process chamber 201 according to processing procedures similar to those of the purge in A1 (purge).

[Step C2]

After C1 is completed, $NH_3$ gas is supplied to the wafer 200 in the process chamber 201, namely to the Si-containing layer formed on the SiCN film on the wafer 200 ($NH_3$ gas supply). Specifically, the valve 243d is opened to allow the $NH_3$ gas to flow through the gas supply pipe 232d. The flow rate of the $NH_3$ gas is adjusted by the MFC 241d. The $NH_3$ gas is supplied into the process chamber 201 via the gas supply pipe 232b and the nozzle 249b and is exhausted through the exhaust port 231a. In this operation, the $NH_3$ gas is supplied to the wafer 200. Simultaneously, the valves 243f and 243g may be opened to supply $N_2$ gas into the process chamber 201 via the nozzles 249a and 249b.

The processing condition in this step may be exemplified as follows:

$NH_3$ gas supply flow rate: 0.1 to 10 slm
Supply time of $NH_3$ gas: 1 to 120 seconds or 1 to 60 seconds in some embodiments
Processing pressure: 1 to 4,000 Pa or 1 to 3,000 Pa in some embodiments.

The other processing conditions may be similar to the processing conditions of A1 of the aforementioned embodiments.

By supplying the $NH_3$ gas to the wafer 200 under the aforementioned conditions, at least a portion of the Si-containing layer formed on the SiCN film on the wafer 200 is nitrided (modified). By modifying the Si-containing layer, a layer containing Si and N, i.e., a silicon nitride layer (SiN layer), is formed on the wafer 200. When forming the SiN layer, an impurity such as Cl contained in the Si-containing layer constitutes a gaseous substance containing at least Cl in the process of the modifying reaction of the Si-containing layer by the $NH_3$ gas and is exhausted from the interior of the process chamber 201. Thus, the SiN layer becomes a layer having fewer impurities such as Cl than the Si-containing layer formed in C1.

After the SiN layer is formed, the valve 243d is closed to stop the supply of the NH$_3$ gas into the process chamber 201. Then, the gas or the like, which remains in the process chamber 201, is removed from the interior of the process chamber 201 according to processing procedures similar to those of the purge in A1 (purge).

As the reaction gas (the N-and-H-containing gas), it may be possible to use, for example, hydrogen nitride-based gas such as diazene (N$_2$H$_2$) gas, hydrazine (N$_2$H$_4$) gas, N$_3$H$_8$ gas, or the like, as well as the NH$_3$ gas.

[Step C3]

After C2 is completed, O$_2$ gas is supplied to the wafer 200 in the process chamber 201, namely to the SiN layer formed on the SiCN film on the wafer 200 according to processing procedures and processing conditions similar to those of B3 described above (O$_2$ gas supply). Thus, at least a portion of the SiN layer formed on the SiCN film on the wafer 200 is oxidized (modified) to form a silicon oxynitride layer (SiON layer) as a layer containing Si, O, and N on the wafer 200, namely on the SiCN film on the wafer 200. When forming the SiON layer, an impurity such as Cl contained in the SiN layer constitutes a gaseous substance containing at least Cl in the process of the modifying reaction of the SiN layer by the O$_2$ gas and is exhausted from the interior of the process chamber 201. Thus, the SiON layer becomes a layer having fewer impurities such as Cl than the Si-containing layer formed in C1 or the SiN layer formed in C2.

After the SiON layer is formed on the SiCN film, the supply of the NH$_3$ gas into the process chamber 201 is stopped, and the gas or the like remaining in the process chamber 201 is removed from the interior of the process chamber 201 according to processing procedures similar to those of the purge in A1 (purge).

[Performing a Predetermined Number of Times]

A cycle which non-simultaneously, i.e., non-synchronously, performs C1 to C3 is performed a predetermined number of times (n times, where n is an integer of 1 or more), whereby a SiON film having a predetermined composition and a predetermined thickness can be formed on the wafer 200, namely on the SiCN film formed on the wafer 200 by performing the first film formation.

Furthermore, in the process of forming the SiON film in the second film formation, O atoms derived from the oxidizing gas (here, O$_2$ gas), for example, a portion of the O component contained in the oxidizing gas supplied to the wafer 200 or a portion of the O component contained in the SiON layer formed on the wafer 200 can also be supplied to the SiCN film which is the underlayer of the second film formation. Thus, the SiCN film can be modified (oxidized) into a SiOCN film having a lower dielectric constant than the SiCN film by substituting at least a portion of C atoms contained in the SiCN film, which is the underlayer of the second film formation, with O atoms, and then by diffusing the O component to be added into this film. In this operation, the SiCN film may be modified into a SiOCN film having an O concentration higher than a N concentration depending on the conditions. Furthermore, the SiCN film may be modified into a SiON film not containing C, and further into a SiON film having the O concentration higher than the N concentration depending on the conditions.

In addition, when the second film formation is completed in the second film formation, the entire SiCN film can be modified into the SiOCN film or the SiON film. Thus, as illustrated in FIG. 7C, a laminated film formed by sequentially laminating a first film (the SiOCN film or the SiON film) and a second film (the SiON film) which have low dielectric constants can be formed on the wafer 200, namely on the SiN film exposed on the wafer 200. This laminated film becomes a so-called low-k film.

Even in the present embodiments, effects similar to those of the aforementioned embodiments may be achieved.

That is, by performing the first film formation before performing the second film formation, it is possible to block the O atoms (O component) which are derived from the oxidizing gas and tend to diffuse downward below the SiCN film, i.e., the O component which tends to reach the underlayer, when performing the second film formation. By the diffusion blocking action of the O component by the SiCN film, it is possible to suppress the oxidation of the underlayer.

Furthermore, in the first film formation, the C concentration can be set higher than the N concentration in the SiCN film, and thus, it is possible to further enhance the oxidation blocking effect of the underlayer achieved in the second film formation and to further suppress the oxidation of the underlayer.

Moreover, in the second film formation, the SiON film having a low dielectric constant can be formed on the wafer 200 by using the second process gas including the oxidizing gas.

In addition, by performing the second film formation, the SiCN film formed by the first film formation can be oxidized and modified into the SiOCN film or the SiON film having a low dielectric constant. Thus, the laminated film formed by laminating the first film and the second film may become a low-dielectric-constant film.

Furthermore, by setting the thickness of the SiON film formed by the second film formation larger than the thickness of the SiCN film formed by the first film formation, it is possible to promote the oxidation of the SiCN film and to further lower the dielectric constant of the laminated film formed by laminating the first film and the second film. Moreover, by increasing the ratio of the thickness of the second film to the total thickness of the laminated film, it is possible to make the average dielectric constant of the laminated film close to the dielectric constant of the second film.

As described above, even in the present embodiments, it is possible to suppress the oxidation of the underlayer while allowing the oxide film (the laminated film of the first film and the second film) formed on the underlayer (SiN film) to become a low-dielectric-constant film.

Furthermore, even in the present embodiments, by setting the temperature conditions in the first film formation and the second film formation identical, it is possible to improve the throughput of substrate processing.

Moreover, the effects of the present embodiments can be similarly achieved in cases where precursor gas other than the HCDS gas is used, in cases where N-containing gas other than the NH$_3$ gas is used, in cases where O-containing gas other than the O$_2$ gas is used, or in cases where inert gas other than the N$_2$ gas is used.

Other Embodiments of the Present Disclosure

While some embodiments of the present disclosure have been described in detail above, the present disclosure is not limited to the aforementioned embodiments but may be variously modified without departing from the spirit of the present disclosure.

For example, in the aforementioned embodiments, there have been described examples in which a wafer including an underlayer (a W film or a SiN film) formed in advance on its surface is prepared, and the wafer is loaded into the process chamber to perform the first film formation and the second film formation, i.e., examples in which formation of the underlayer and formation of a laminated film on the underlayer (the first film formation and the second film formation) are performed in separate process chambers (ex-situ). However, for example, as in film-forming sequences illustrated below, the formation of the SiN film as the underlayer and the formation of the laminated film on the underlayer may be performed in the same process chamber (in-situ). Furthermore, 1 and n in the following film-forming sequences each indicate an integer of 1 or more, and m indicates an integer in a range of 1 to 3.

(HCDS→NH$_3$)×$l$→(HCDS→TEA)×$m$→
(HCDS→NH$_3$→O$_2$)×$n$

In addition, for example, as in the film-forming sequences illustrated below, the formation of the underlayer and the first film formation may be performed in-situ, and the first film formation and the second film formation may be performed ex-situ.

(HCDS→NH$_3$)×$l$→(HCDS→TEA)×$m$ (HCDS→NH$_3$→O$_2$)×$n$

Furthermore, for example, as in the film-forming sequences illustrated below, the formation of the underlayer and the first film formation may be performed ex-situ, and the first film formation and the second film formation may be performed ex-situ.

(HCDS→NH$_3$)×$l$ (HCDS→TEA)×$m$ (HCDS→NH$_3$→O$_2$)×$n$

Even in these cases, effects similar to those of the aforementioned embodiments may be achieved. In addition, when the formation of the underlayer and the formation of the laminated film on the underlayer are performed in-situ, the interface between the underlayer and the first film and the interface between the first film and the second film may become easy to be kept in a clean state.

Furthermore, for example, by performing a film-forming process under processing procedures and processing conditions similar to those of the first film formation after performing the second film formation, a SiCN film may be formed as a third film (cap layer) containing Si, C, and N and not containing O on the second film, namely on the outermost surface of the laminated film. This makes it possible to improve ashing resistance and wet etching resistance of the laminated film including the cap layer in a well-balanced manner. In addition, the thickness of the third film (third thickness) may be smaller than the thickness of the second film (second thickness) in order to avoid an increase in the total dielectric constant of the laminated film including the cap layer.

In the aforementioned embodiments, the W film which is an elemental metal film has been exemplified as the conductive metal-containing film exposed on the surface of the substrate, but the present disclosure is not limited to the embodiments. For example, the conductive metal-containing film exposed on the surface of the substrate may be a metal nitride film such as a titanium nitride film (TiN film), a tungsten nitride film (WN film), or the like, or an elemental metal film such as an aluminum film (Al film), a cobalt film (Co film), a nickel film (Ni film), a platinum film (Pt film), a copper film (Cu film), or the like. Even in these cases, effects similar to those of the aforementioned embodiments may be achieved. Furthermore, in the present disclosure, the conductive metal-containing film such as the TiN film, the W film, or the like may be simply referred to as a metal film.

In the first film formation, as the first process gas (precursor gas), it may be possible to use, alkylhalosilane-based gas such as 1,1,2,2-tetrachloro-1,2-dimethyldisilane ((CH$_3$)$_2$Si$_2$Cl$_4$, abbreviation: TCDMDS) gas, alkylsilane-based gas such as hexamethyldisilane ((CH$_3$)$_3$—Si—Si—(CH$_3$)$_3$, abbreviation: HMDS) gas, or alkylenesilane-based gas such as 1,4-disilabutane (Si$_2$C$_2$H$_{10}$, abbreviation: DSB) gas, as well as various kinds of halosilane-based gases described above such as the HCDS gas or the like. Furthermore, as the first process gas (reaction gas), it may be possible to use, N-containing gas such as NH$_3$ gas or C-containing gas such as C$_3$H$_6$ gas, as well as various kinds of N-and-C-containing gases described above such as the TEA gas or the like. Then, the SiCN film may be formed as the first film on the wafer in which the underlayer of at least one selected from the group of the conductive metal-containing film and the nitride film is exposed on the surface by the gas supply sequences illustrated below. Even in these cases, effects similar to those of the aforementioned embodiments may be achieved. The alkylhalosilane-based gas, the alkylsilane-based gas, and the alkylenesilane-based gas are gases acting as a Si source and a C source, respectively.

(TCDMDS→NH$_3$)×$m$⇒SiCN (HMDS→NH$_3$)×$m$⇒SiCN (DSB→NH$_3$)×$m$⇒SiCN (HCDS→C$_3$H$_6$→NH$_3$)×$m$⇒SiCN

In the second film formation, as the second process gas (precursor gas), it may be possible to use, alkylhalosilane-based gas such as TCDMDS gas, alkylsilane-based gas such as HMDS gas, or alkylenesilane-based gas such as DSB gas, as well as various kinds of halosilane-based gases described above such as the HCDS gas or the like. Furthermore, as the second process gas (reaction gas), it may be possible to use C-containing gas such as C$_3$H$_6$ gas or the like, as well as various kinds of N-and-C-containing gases, N-containing gases, and O-containing gases described above such as the TEA gas, the NH$_3$ gas, the O$_2$ gas, or the like. In addition, a SiOCN film or a SiON film may be formed as the second film on the wafer 200, namely on the first film by the gas supply sequences illustrated below. Even in these cases, effects similar to those of the aforementioned embodiments may be achieved.

(HCDS→O$_2$→TEA)×$n$⇒SiOCN (HCDS→C$_3$H$_6$→NH$_3$→O$_2$)×$n$⇒SiOCN (HCDS→C$_3$H$_6$→O$_2$→NH$_3$)×$n$⇒SiOCN (TCDMDS→NH$_3$→O$_2$)×$n$⇒SiOCN (TCDMDS→O$_2$→NH$_3$)×$n$⇒SiOCN (HCDS→O$_2$→NH$_3$)×$n$⇒SiON (DCS→NH$_3$→O$_2$)×$n$⇒SiON (DCS→O$_2$→NH$_3$)×$n$⇒SiON

Recipes used in substrate processing may be prepared individually according to the processing contents and may be stored in the memory device 121c via a telecommunication line or the external memory device 123. Moreover, at the start of the substrate processing, the CPU 121a may properly select an appropriate recipe from the recipes stored in the memory device 121c according to the processing contents. Thus, it is possible for a single substrate processing apparatus to form films of different kinds, composition ratios, qualities and thicknesses with enhanced reproducibility. In addition, it is possible to reduce an operator's burden and to quickly start the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiments, there have been described examples in which films are formed using a batch-type substrate processing apparatus capable of processing a plurality of substrates at a time. The present disclosure is not limited to the aforementioned embodiments but may be appropriately applied to, e.g., cases where films are formed using a single-wafer-type substrate processing apparatus capable of processing a single substrate or several substrates at a time. In addition, in the aforementioned embodiments, there have been described examples in which films are formed using the substrate processing apparatus provided with a hot-wall-type process furnace. The present disclosure is not limited to the aforementioned embodiments but may be appropriately applied to cases where films are formed using a substrate processing apparatus provided with a cold-wall-type process furnace.

In the case of using these substrate processing apparatuses, each processing may be performed by the processing procedures and processing conditions similar to those of the aforementioned embodiments. Effects similar to those of the aforementioned embodiments may be achieved.

The embodiments described above may be appropriately combined with one another. The processing procedures and processing conditions in the embodiments may be similar to, for example, the processing procedures and processing conditions of the aforementioned embodiments.

According to the present disclosure in some embodiments, it is possible to provide a technique capable of suppressing oxidation of an underlayer while allowing a film formed on a substrate to become a low-dielectric-constant film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
   (a) forming a first film having a first thickness and a carbon concentration of 30% or higher on an underlayer which is formed on a surface of the substrate by supplying a first process gas to the substrate, wherein the first film contains silicon, carbon, and nitrogen and the first process gas does not include oxidizing gas; and
   (b) forming a second film having a second thickness on the first film by supplying a second process gas to the substrate, wherein the second film contains silicon, oxygen, and nitrogen and the second process gas includes oxidizing gas,
   wherein in (b), oxygen atoms, which are derived from the oxidizing gas and diffuse from a surface of the first film toward the underlayer, are absorbed by the first film and the first film is modified.

2. The method according to claim 1, wherein the carbon concentration is higher than a nitrogen concentration in the first film formed in (a).

3. The method according to claim 1, wherein the first process gas includes silicon-containing gas and nitrogen-and-carbon-containing gas, and
   wherein in (a), a silicon carbonitride film is formed as the first film by non-simultaneously supplying the silicon-containing gas and the nitrogen-and-carbon-containing gas to the substrate.

4. The method according to claim 3, wherein the silicon-containing gas includes halosilane-based gas, and the nitrogen-and-carbon-containing gas includes at least one selected from the group of amine-based gas and organic hydrazine-based gas.

5. The method according to claim 1, wherein the first thickness is in a range of 0.05 nm to 0.15 nm.

6. The method according to claim 1, wherein the second process gas includes silicon-containing gas, nitrogen-containing gas, and oxygen-containing gas, and
   wherein in (b), a silicon oxycarbonitride film or a silicon oxynitride film is formed as the second film by non-simultaneously supplying the silicon-containing gas, the nitrogen-containing gas, and the oxygen-containing gas to the substrate.

7. The method according to claim 6, wherein the nitrogen-containing gas includes nitrogen-and-carbon-containing gas, and
   wherein in (b), the silicon oxycarbonitride film is formed as the second film.

8. The method according to claim 7, wherein the silicon-containing gas includes halosilane-based gas, and the nitrogen-and-carbon-containing gas includes at least one selected from the group of amine-based gas and organic hydrazine-based gas.

9. The method according to claim 6, wherein the nitrogen-containing gas includes nitrogen-and-hydrogen-containing gas, and
   wherein in (b), the silicon oxynitride film is formed as the second film.

10. The method according to claim 9, wherein the silicon-containing gas includes halosilane-based gas, and the nitrogen-and-hydrogen-containing gas includes hydrogen nitride-based gas.

11. The method according to claim 1, wherein in (b), at least a portion of carbon atoms contained in the first film is substituted with the oxygen atoms.

12. The method according to claim 1, wherein in (b), the first film is modified into a silicon oxycarbonitride film or a silicon oxynitride film.

13. The method according to claim 1, wherein in (b), the first film is modified into a silicon oxycarbonitride film or a silicon oxynitride film whose oxygen concentration is higher than a nitrogen concentration.

14. The method according to claim 1, wherein (a) and (b) are performed in the same process chamber.

15. The method according to claim 1, further comprising (c) forming a nitride film as the underlayer on the surface of the substrate before performing (a),
   wherein at least (c) and (a) are sequentially performed in the same process chamber.

16. The method according to claim 15, wherein (b) is performed in a process chamber different from the process chamber in which (c) and (a) are performed.

17. The method according to claim 1, further comprising (d) forming a third film having a third thickness on the second film by supplying the first process gas after performing (b),
   wherein the third film contains silicon, carbon, and nitrogen.

18. The method according to claim 1, wherein the first film formed in (a) has a carbon concentration of 50% or lower.

19. The method according to claim 1, wherein the underlayer is at least one selected from the group of a conductive metal-element-containing film and a nitride film.

20. The method according to claim 1, wherein the second thickness is larger than the first thickness.

21. A non-transitory computer-readable recording medium storing a program that causes, by a computer, a substrate processing apparatus to perform a process comprising the method of claim 1.

22. A substrate processing apparatus, comprising:
   a process chamber in which a substrate is processed;
   a first process gas supply system configured to supply a first process gas, which does not include oxidizing gas, to the substrate in the process chamber;
   a second process gas supply system configured to supply a second process gas, which includes oxidizing gas, to the substrate in the process chamber; and
   a controller configured to be capable of controlling the first process gas supply system and the second process gas supply system to perform a process comprising:
     (a) forming a first film having a first thickness and a carbon concentration of 30% or higher on an underlayer which is formed on a surface of the substrate by supplying the first process gas to the substrate, wherein the first film contains silicon, carbon, and nitrogen; and
     (b) forming a second film having a second thickness on the first film by supplying the second process gas to the substrate, wherein the second film contains silicon, oxygen, and nitrogen,
   wherein in (b), oxygen atoms, which are derived from the oxidizing gas and diffuse from a surface of the first film toward the underlayer, are absorbed by the first film and the first film is modified.

23. A method of manufacturing a semiconductor device, comprising:
   (a) forming a first film having a first thickness and a carbon concentration of 30% or higher on an underlayer which is formed on a surface of a substrate by supplying a first process gas to the substrate, wherein the first film contains silicon, carbon, and nitrogen and the first process gas does not include oxidizing gas; and
   (b) forming a second film having a second thickness on the first film by supplying a second process gas to the substrate, wherein the second film contains silicon, oxygen, and nitrogen and the second process gas includes oxidizing gas,
   wherein in (b), oxygen atoms, which are derived from the oxidizing gas and diffuse from a surface of the first film toward the underlayer, are absorbed by the first film and the first film is modified.

* * * * *